United States Patent
Jeong et al.

(10) Patent No.: US 10,539,616 B2
(45) Date of Patent: Jan. 21, 2020

(54) SCAN DATA CONTROL APPARATUS AND ELECTRONIC SYSTEM HAVING THE SAME

(71) Applicant: SAMSUNG ELECTRONICS CO., LTD., Suwon-si, Gyeonggi-do (KR)

(72) Inventors: Kyoung-Heon Jeong, Suwon-si (KR); Ho-Sung Kim, Hwaseong-si (KR); Sung-Jae Lee, Hwasung (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 167 days.

(21) Appl. No.: 15/680,109

(22) Filed: Aug. 17, 2017

(65) Prior Publication Data

US 2018/0180675 A1    Jun. 28, 2018

(30) Foreign Application Priority Data

Dec. 22, 2016 (KR) .................... 10-2016-0176992

(51) Int. Cl.
*G01R 31/317* (2006.01)
*G01R 31/3177* (2006.01)
*G01R 31/3185* (2006.01)

(52) U.S. Cl.
CPC ... *G01R 31/31725* (2013.01); *G01R 31/3177* (2013.01); *G01R 31/31701* (2013.01); *G01R 31/318544* (2013.01); *G01R 31/31705* (2013.01); *G01R 31/318513* (2013.01)

(58) Field of Classification Search
CPC ...... G01R 31/31725; G01R 31/318544; G01R 31/318555; G01R 31/3177; G01R 31/31701; G01R 31/31705; G01R 31/318513

USPC .................................................. 714/731, 733
See application file for complete search history.

(56) References Cited

U.S. PATENT DOCUMENTS

| | | | |
|---|---|---|---|
| 5,751,735 A * | 5/1998 | Tobin ...................... | G06F 11/27 714/30 |
| 6,026,501 A * | 2/2000 | Hohl .................... | G06F 11/3636 714/29 |
| 6,550,031 B1 | 4/2003 | Godfrey et al. | |
| 6,826,717 B1 * | 11/2004 | Draper ............. | G01R 31/31725 714/39 |
| 6,854,081 B1 * | 2/2005 | Suzuki ............... | G01R 31/3185 714/10 |
| 7,036,046 B2 * | 4/2006 | Rally ............... | G01R 31/31705 714/39 |

(Continued)

FOREIGN PATENT DOCUMENTS

| KR | 20130112034 A | 10/2013 |
|---|---|---|
| KR | 1539933 B | 7/2015 |
| KR | 1641108 B | 7/2016 |

*Primary Examiner* — James C Kerveros
(74) *Attorney, Agent, or Firm* — Volentine, Whitt & Francos, PLLC

(57) ABSTRACT

A scan data control apparatus includes a trigger circuit, a scan sequencer, a shift register, and a transmitter. The trigger circuit is configured to receive a trigger signal, detect a malfunction of a system and output a scan mode start signal and a scan mode end signal. The scan sequencer is configured to output scan enable signals corresponding to a CPU and a master to the CPU and the master. The shift register is configured to receive scan data of the CPU and the master from the CPU and the master. The transmitter is configured to receive the scan data of the CPU and the master and output the scan data to a memory.

19 Claims, 8 Drawing Sheets

(56) References Cited

U.S. PATENT DOCUMENTS

| | | | |
|---|---|---|---|
| 7,076,767 B1 | 7/2006 | Williams | |
| 7,359,820 B1 * | 4/2008 | Browne | G06F 11/3688 |
| | | | 702/108 |
| 7,890,830 B1 * | 2/2011 | Wada | G01R 31/31813 |
| | | | 714/715 |
| 8,555,120 B2 | 10/2013 | Ahn et al. | |
| 8,560,903 B2 * | 10/2013 | Wang | G06F 11/27 |
| | | | 714/726 |
| 8,874,883 B2 | 10/2014 | Williams et al. | |
| 9,158,661 B2 | 10/2015 | Blaine et al. | |
| 9,810,738 B2 * | 11/2017 | Tsuboi | G01R 31/3177 |
| 2002/0138801 A1 | 9/2002 | Wang et al. | |
| 2002/0174394 A1 * | 11/2002 | Ledford | G01R 31/3187 |
| | | | 714/733 |
| 2003/0237023 A1 | 12/2003 | Satoh et al. | |
| 2010/0037111 A1 * | 2/2010 | Ziaja | G01R 31/3016 |
| | | | 714/744 |
| 2011/0041017 A1 * | 2/2011 | Zhong et al. | G06F 11/3648 |
| | | | 714/724 |
| 2015/0293173 A1 * | 10/2015 | Tsuboi | G01R 31/3177 |
| | | | 714/727 |

\* cited by examiner

SCAN DATA CONTROL APPARATUS AND ELECTRONIC SYSTEM HAVING THE SAME

CROSS-REFERENCE TO RELATED APPLICATION

This application claims priority under 35 USC § 119 to Korean Patent Application No. 10-2016-0176992, filed on Dec. 22, 2016 in the Korean Intellectual Property Office (KIPO), the contents of which are herein incorporated by reference in their entirety.

BACKGROUND

1. Technical Field

Exemplary embodiments relate to a scan data control apparatus and an electronic system having the scan data control apparatus. More particularly, exemplary embodiments relate to a scan data control apparatus for easier analysis of hardware logic and an electronic system having the scan data control apparatus.

2. Description of the Related Art

An SOC indicates a chip or a system on the chip in which various semiconductor components are integrated as one chip. As convergence and integration is progressed between computers, communication devices, and other processing devices, the recent market trend is away from conventional application specific integrated circuits (ASICs) and application specific standard products (ASSPs), toward SOC technologies. In addition, miniaturization trends and high-performance requirements of electronic devices have factored into continuing development of the SOC.

More components are integrated in one chip according to an increase of integration degree of the SOC and also an operational speed of the SOC increases gradually. However, as the integration degree of the SOC increases, analysis of a cause of a malfunction becomes more difficult when the malfunction occurs.

A debugging may be implemented using logs of the software to analyze the reason of the malfunction. However, it is difficult to determine the operation of the SOC precisely using only the logs of the software. In addition, if the malfunction occurs from a problem of hardware, the reason of the malfunction may not be determined by the logs of the software.

SUMMARY

Exemplary embodiments of the present disclosure provide a scan data control apparatus that stores scan data of hardware to a memory to analyze a problem of hardware logic when a malfunction of a system has occurred.

Exemplary embodiments of the present disclosure also provide an electronic system including the scan data control apparatus.

In an exemplary embodiment of a scan data control apparatus according to the present disclosure, the scan data control apparatus includes a trigger part, a scan sequencer, a shift register, and a transmitter. The trigger part is configured to receive a trigger signal, detect a malfunction of a system and output a scan mode start signal and a scan mode end signal. The scan sequencer is configured to output scan enable signals corresponding to a central processing unit (CPU) and a master to the CPU and the master. The shift register is configured to receive scan data of the CPU and the master from the CPU and the master. The transmitter is configured to receive the scan data of the CPU and the master and output the scan data within a memory.

In an exemplary embodiment of an electronic system according to the present disclosure, the electronic system includes a bus, a memory, a CPU, a master, a power management unit, a memory, and a scan data control apparatus. The bus is configured to transmit data. The memory is configured to store the data. The CPU and the master are connected to the bus. The power management unit is connected to the bus and configured to provide power to the CPU and the master. The memory interface is connected to the bus and configured to control an operation of the memory. The scan data control apparatus is configured to detect a malfunction of a system and store scan data of the CPU and the master within the memory.

In an exemplary embodiment of the disclosure, a system on chip includes a scan control circuit that detects a system malfunction and communicates a scan mode start signal in response to detecting the malfunction. A power management circuit communicates a scan request signal to a processor in response to receiving the scan mode start signal from the scan control circuit. And the processor communicates, in response to a scan enable signal received from the scan control circuit, scan data to the scan control circuit for storage in a memory device.

According to the scan data control apparatus and the electronic system including the scan data control apparatus, the scan data control apparatus controls the CPU and the master in the scan mode and the scan data may be stored within the memory of the electronic system. Thus, the reason for the malfunction of the system may be analyzed using only the scan data of the hardware stored in the memory. As a result, debugging of the electronic system may be efficiently implemented.

BRIEF DESCRIPTION OF THE DRAWINGS

The above and other features and advantages of the present disclosure will become more apparent by describing detailed exemplary embodiments thereof with reference to the accompanying drawings, in which.

DETAILED DESCRIPTION OF THE EMBODIMENTS

Figure 1:
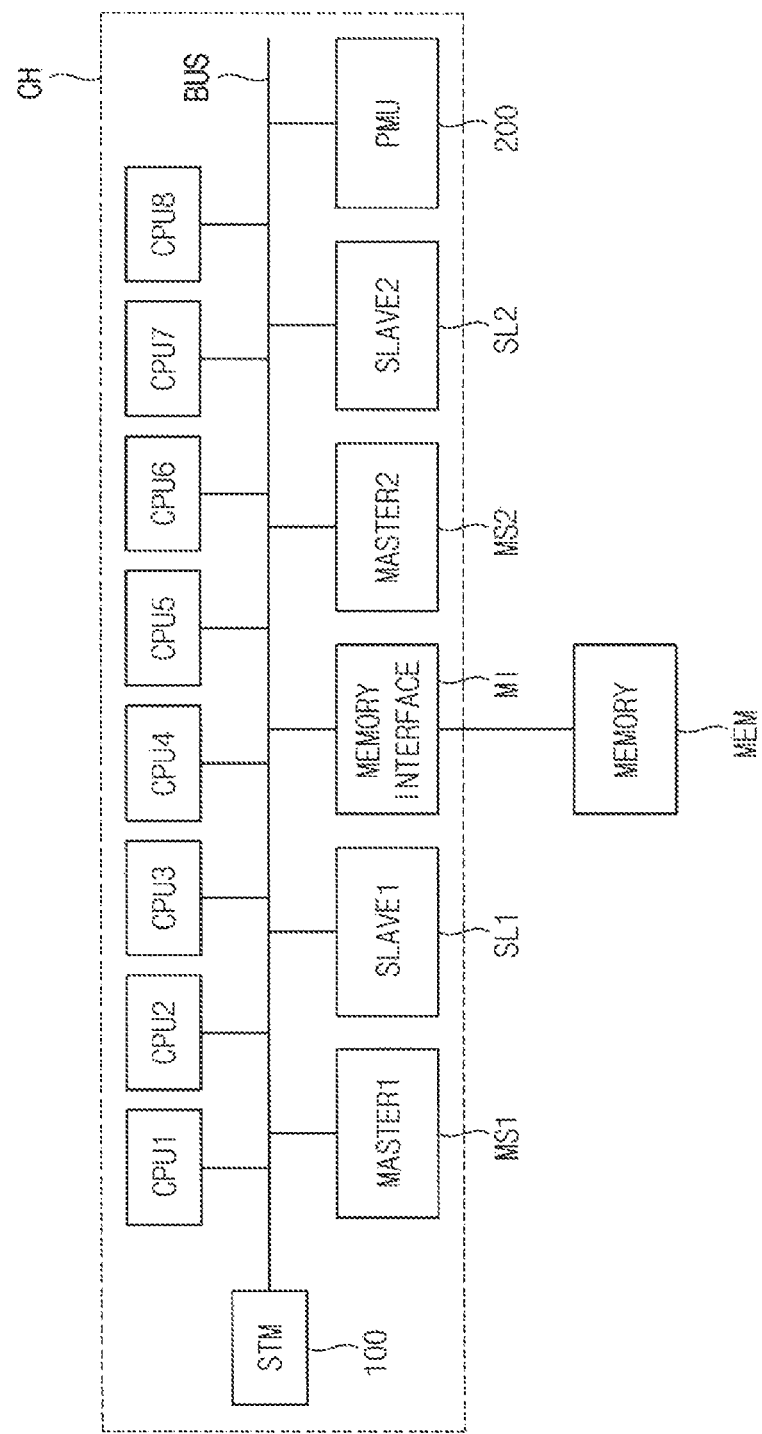
FIG. 1 is a block diagram illustrating a system on chip (SOC) and a memory according to exemplary embodiments.

Various exemplary embodiments will be described more fully with reference to the accompanying drawings, in which embodiments are shown. The present disclosure may, however, be embodied in many different forms and should not be construed as limited to the embodiments set forth herein. Like reference numerals refer to like elements throughout this application.

FIG. 1 is a block diagram illustrating a system on chip (SOC) and a memory according to exemplary embodiments.

Referring to FIG. 1, the system on chip (SOC) CH includes a bus transmitting data, a central processing unit (CPU) connected to the bus and controlling an operation of a system, a master connected to the bus and generating control, and a slave connected to the bus and receiving or outputting the data according to the control of the master.

For example, SOC CH may include a plurality of the CPUs CPU1 to CPU8, a plurality of the masters MS1 and MS2 and a plurality of slaves SL1 and SL2.

The SOC CH may further include a power management unit (PMU) 200. The PMU 200 is connected to the bus and may provide power to the CPU, the master MS1 and MS2 and the slave SL1 and SL2. The PMU 200 may provide a clock signal to the CPU, the master MS1 and MS2 and the slave SL1 and SL2.

The SOC CH may further include a memory interface MI connected to the bus and a memory MEM and controlling the operation of the memory MEM.

For example, the memory MEM may be a volatile memory device. For example, the memory MEM may be one of a dynamic random access memory (DRAM) device, a static random access memory (SRAM) device or a mobile DRAM device.

In the present exemplary embodiment, the memory MEM may be formed independently from the SOC CH and externally to the SOC CH.

The SOC CH may further include a scan data control apparatus (STM) 100. The scan data control apparatus 100 may detect a malfunction of the system. The scan data control apparatus 100 may store scan data of the CPU and the master MS1 and MS2 to the memory MEM. The scan data control apparatus 100 may further store the scan data of the slave SL1 and SL2 to the memory MEM.

Although the SOC CH includes a single bus in FIG. 1, the present disclosure is not limited thereto. The SOC CH may include a plurality of buses. The plurality of buses may be connected to each other by a connecting bus.

The masters included in the SOC CH may be one of a graphic processing unit, a communication processing unit, a global navigation satellite system and a Wi-Fi module.

For example, the communication processing unit may include at least one of a code division multiple access (CDMA) module, a long term evolution (LTE) module, a radio frequency (RF) module, an ultra wideband (UWB) module, a wireless local area network (WLAN) module and a worldwide interoperability for microwave access (WI-MAX) module.

The master may be divided into a hard realtime master, a soft realtime master and a best effort master depending on the type or the operational characteristic of the master.

The hard realtime master is a master such as a display device that consumes data steadily and thus requires a necessary bandwidth. An underrun of a data buffer in the hard realtime master may be caused if the necessary bandwidth is not satisfied. The hard realtime master buffers the serviced data sufficiently in the data buffer if the necessary bandwidth is satisfied and controls the request flow itself such that the hard realtime master issues a request according to the amount of the consumed data.

The soft realtime master is a master such as a video codec that requires an average operation time. The video codec has a frame rate such as 30 or 60 frames per second and requires an average decode/encode time. The bandwidth requirement level of the video codec may be changed according to respective frames and the video codec requires an average encoding time and/or an average decoding time. The video codec tends to execute the encoding/decoding of the next frame as soon as possible if the request flow is not controlled, but issuance of requests is limited due to a dependency between previously and currently processed data. Thus the operation speed of the video codec may satisfy the determined frame rate if the required bandwidth and/or latency are secured, but the operation speed of the codec may be sharply decreased if the latency becomes greater than a threshold value.

The best effort master is a master such as two-dimensional or three-dimensional graphics engine that issues requests endlessly if the request flow is not controlled and thus request flow control is essential in the best effort master. It is desirable to support a maximum service requirement level of the best effort master if another master of higher priority than the best effort master is not in an urgent state. If the other master is in the urgent state, the request flow from the best effort master has to be limited so that the other master of higher priority may escape from the urgent state.

The CPU included in the SOC may perform various computational functions such as particular calculations and tasks. For example, the CPU may be a microprocessor, an application processor (AP), etc. In some example embodiments, the CPU may include a single processor core or multiple processor cores. In some example embodiments, the CPU may further include a cache memory that is located inside or outside the CPU.

Figure 2:
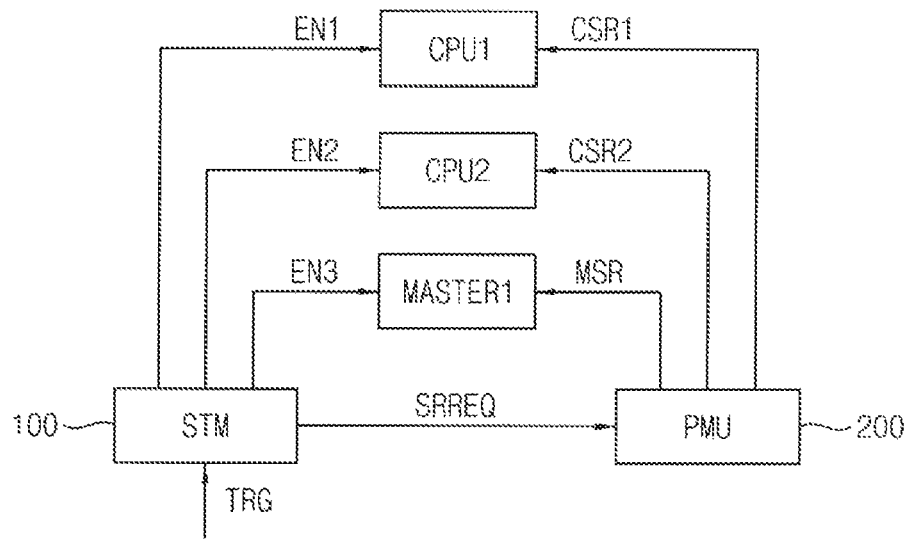
FIG. 2 is a block diagram illustrating a scan data control apparatus and a power management unit of FIG. 1.
Figure 3:
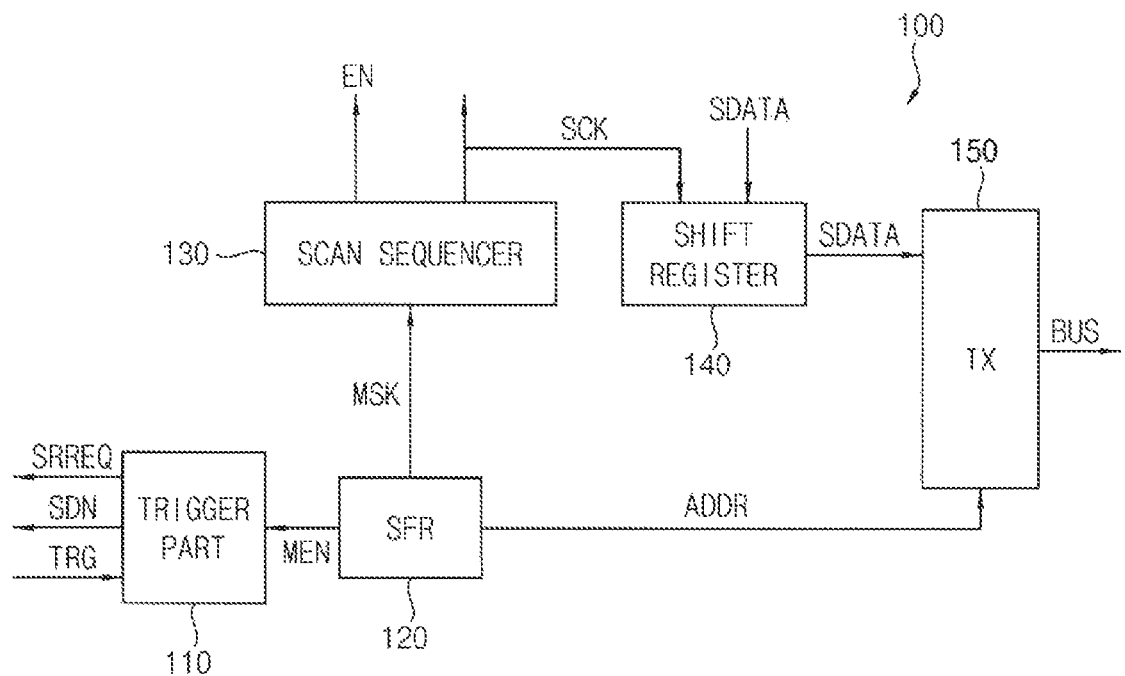
FIG. 3 is a block diagram illustrating a detailed structure of the scan data control apparatus of FIG. 1.

FIG. 2 is a block diagram illustrating the scan data control apparatus 100 and the power management unit 200 of FIG. 1. FIG. 3 is a block diagram illustrating a detailed structure of the scan data control apparatus 100 of FIG. 1.

Hereinafter, the operations of the scan data control apparatus 100 and the power management unit 200 are briefly explained referring to FIG. 2.

When the scan data control apparatus 100 receives a trigger signal TRG representing a malfunction of the system, the power management unit 200 outputs a scan mode start signal SRREQ.

The power management unit 200 may output a scan request signal to the CPUs and the masters in the SOC to indicate the scan mode. For example, the power management unit 200 may output a first scan request signal CSR1 to a first CPU CPU1 to indicate the scan mode. For example, the power management unit 200 may output a second scan request signal CSR2 to a second CPU CPU2 to indicate the scan mode. For example, the power management unit 200 may output a third scan request signal MSR to a first master MASTER1 to indicate the scan mode.

For convenience of explanation, although the two CPUs and the single master are illustrated in FIG. 2, the present disclosure is not limited thereto. All of the CPUs and all of the masters in the SOC may be operated by controls of the scan data control apparatus 100 and the power management unit 200. In addition, although not shown in figures, the slaves may output the scan data of the slaves to the scan data control apparatus 100 without receiving a scan enable signal.

When some of the CPUs and the masters are temporally turned off, the CPUs and the masters which are turned off may be turned on by the scan request signal.

When some of the CPUs and the masters are driven by a clock signal which is greater or less than a normal clock signal, the CPUs and the masters may be driven by a proper clock for the scan mode by the scan request signal.

The scan data control apparatus 100 may output corresponding scan enable signals EN1, EN2 and EN3 to the CPUs and the masters. The scan mode is started at the CPUs and the masters by the scan enable signals EN1, EN2 and EN3. When the scan mode is started at the CPUs and the masters, the scan data of the CPUs and the masters are outputted to the scan data control apparatus 100.

For example, the scan data control apparatus 100 may output a first scan enable signal EN1 corresponding to the first CPU CPU1 to the first CPU CPU1.

For example, the scan data control apparatus 100 may output a second scan enable signal EN2 corresponding to the second CPU CPU2 to the second CPU CPU2.

For example, the scan data control apparatus 100 may output a third scan enable signal EN3 corresponding to the first master MASTER1 to the first master MASTER1.

The scan data control apparatus 100 stores the scan data of the CPUs and the masters which are received from the CPUs and the masters to the memory MEM.

When storing the scan data is completed, the scan data control apparatus 100 outputs a scan mode end signal to the power management unit 200.

When the power management unit 200 receives the scan mode end signal, the power management unit 200 resets the system. When the power management unit 200 resets the system, the system excluding the memory MEM may be reset to prevent the deletion of the scan data stored in the memory MEM.

Referring to FIG. 3, the scan data control apparatus 100 includes a trigger part 110, a scan sequencer 130, a shift register 140 and a transmitter 150.

The trigger part 110 detects the malfunction of the system, and outputs the scan mode start signal SRREQ and a scan mode end signal SDN to the power management unit 200. The trigger part 110 may detect the malfunction of the system using the trigger signal TRG.

For example, the trigger part 110 may receive the trigger signal TRG from a watch dog. Alternatively, the trigger part 110 may receive the trigger signal TRG through a key input of a device. For example, if the device is a mobile device and a user pushes a predetermined button for a long time, the trigger part 110 may receive the trigger signal TRG.

The scan sequencer 130 outputs the scan enable signal EN corresponding to the CPU and the master to the CPU and the master. The scan sequencer 130 may output a scan clock signal SCK to the CPU, the master and the shift register 140. The scan clock signal SCK is a clock signal for the operation of the CPU and the master in the scan mode. The scan clock signal SCK may be provided to scan cells of the CPU and the master.

The shift register 140 receives the scan data SDATA of the CPU and the master from the CPU and the master. The shift register 140 may receive the scan data SDATA of the CPU and the master using the scan clock signal SCK received from the scan sequencer 130.

The transmitter 150 receives the scan data SDATA of the CPU and the master from the shift register 140 and outputs the scan data SDATA of the CPU and the master to the memory MEM through the bus.

The scan data control apparatus 100 may further include a special function register 120. The special function register 120 may output an address ADDR to store the scan data SDATA of the CPU and the master to the transmitter 150.

The transmitter 150 may store the scan data SDATA to the address ADDR received form the special function register 120.

The special function register 120 may output a scan mode enable signal MEN determining whether the scan mode is operated or not to the trigger part 110.

When the scan mode enable signal MEN has an enable status, the trigger part 110 outputs the scan mode start signal SRREQ to the power management unit 200 to start the operation of the scan mode.

When the scan mode enable signal MEN has a disabled status, the trigger part 110 does not output the scan mode start signal SRREQ to the power management unit 200. For example, when the scan mode enable signal MEN has the disabled status, the trigger part 110 may operate only the reset of the system in response to the trigger signal TRG.

The special function register 120 may output a masking signal MSK to the scan sequencer 130. At least one of the CPU and the master may not output the scan data SDATA according to the masking signal MSK.

The scan sequencer 130 may not output the scan enable signal to at least one of the CPU and the master which is designated by the masking signal MSK.

Figure 4:
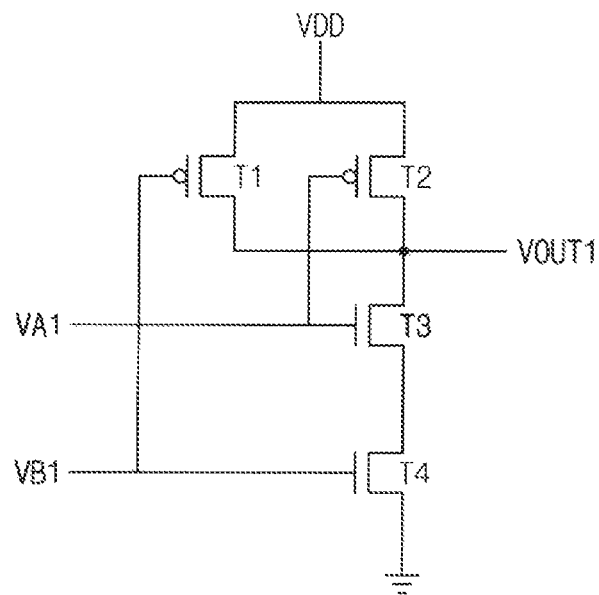
FIG. 4 is a circuit diagram illustrating a NAND gate included in a CPU and a master of FIG. 1.
Figure 5:
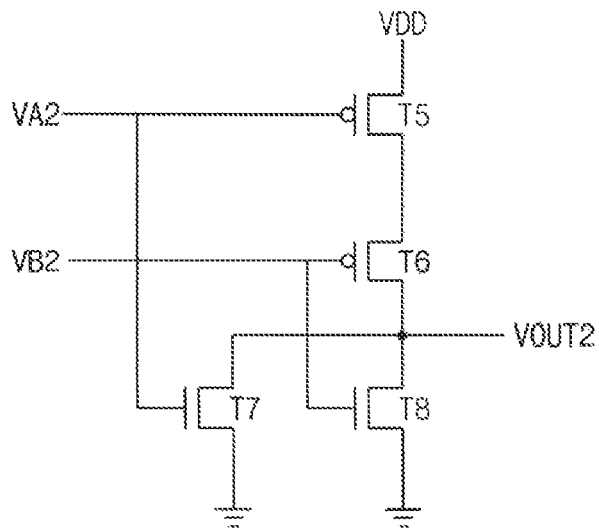
FIG. 5 is a circuit diagram illustrating a NOR gate included in the CPU and the master of FIG. 1.

FIG. 4 is a circuit diagram illustrating a NAND gate included in the CPU and the master of FIG. 1. FIG. 5 is a circuit diagram illustrating a NOR gate included in the CPU and the master of FIG. 1.

Referring to FIGS. 4 and 5, the CPU and the master include a plurality of logic gates. The scan information of the CPU and the master may mean information of a turned-on status or a turned-off status of the transistors of the logic gates in the CPU and the master.

FIG. 4 illustrates the exemplary NAND gate which is representative of one of the logic gates included in the CPU and the master. FIG. 5 illustrates the exemplary NOR gate which is one representative of one of the logic gates included in the CPU and the master.

The NAND gate of FIG. 4 includes first to fourth transistors T1 to T4. The scan information of the NAND gate may mean the turned-on status or the turned-off status of the first to fourth transistors T1 to T4.

For example, the NAND gate includes the second transistor T2 and the third transistor T3 which are connected to a first input terminal VA1 and the first transistor T1 and the fourth transistor T4 which are connected to a second input terminal VB1.

For example, the first transistor T1 and the second transistor T2 may be P-type transistors. For example, the third transistor T3 and the fourth transistor T4 may be N-type transistors.

The first transistor T1 includes a control electrode connected to the second input terminal VB1, an input electrode to which a power voltage VDD is applied and an output electrode connected to an output terminal VOUT1.

The second transistor T2 includes a control electrode connected to the first input terminal VA1, an input electrode to which the power voltage VDD is applied and an output electrode connected to the output terminal VOUT1.

The third transistor T3 includes a control electrode connected to the first input terminal VA1, an input electrode connected to an output electrode of the fourth transistor T4 and an output electrode connected to the output terminal VOUT1.

The fourth transistor T4 includes a control electrode connected to the second input terminal VB1, an input electrode connected to a ground and an output electrode connected to the input electrode of the third transistor T3.

The NOR gate of FIG. 5 includes fifth to eighth transistors T5 to T8. The scan information of the NOR gate may mean the turned-on status or the turned-off status of the fifth to eighth transistors T5 to T8.

For example, the NOR gate includes the fifth transistor T5 and the seventh transistor T7 which are connected to a first input terminal VA2 and the sixth transistor T6 and the eighth transistor T8 which are connected to a second input terminal VB2.

For example, the fifth transistor T5 and the sixth transistor T6 may be P-type transistors. For example, the seventh transistor T7 and the eighth transistor T8 may be N-type transistors.

The fifth transistor T5 includes a control electrode connected to the first input terminal VA2, an input electrode to which a power voltage VDD is applied and an output electrode connected to an input electrode of the sixth transistor T6.

The sixth transistor T6 includes a control electrode connected to the second input terminal VB2, an input electrode connected to the output electrode of the fifth transistor T5 and an output electrode connected to the output terminal VOUT2.

The seventh transistor T7 includes a control electrode connected to the first input terminal VA2, an input electrode connected to a ground and an output electrode connected to the output terminal VOUT2.

The eighth transistor T8 includes a control electrode connected to the second input terminal VB2, an input electrode connected to a ground and an output electrode connected to the output terminal VOUT2.

Figure 6:
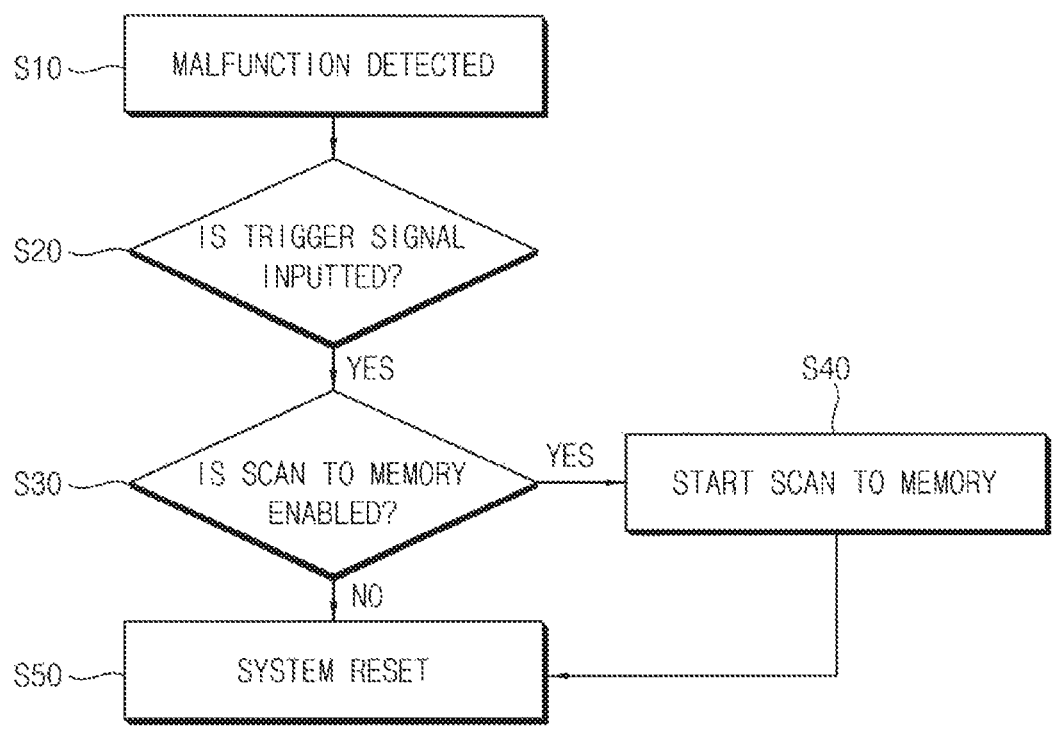
FIG. 6 is a flowchart illustrating an operation of a trigger part of FIG. 3.

FIG. 6 is a flowchart illustrating an operation of the trigger part 110 of FIG. 3.

Referring to FIGS. 3 and 6, when the malfunction is detected (step S10), the trigger signal TRG is inputted to the trigger part 110 (step S20).

When the trigger signal TRG is inputted to the trigger part 110, the trigger part 110 determines whether the scan mode has the enabled status (step S30). For example, the scan mode enable signal MEN stored in the special function register may be determined to determine that the scan mode has the enabled status.

When the scan mode has the enabled status, the trigger part 110 starts the operation of the scan mode (step S40). The trigger part 110 may output the scan mode start signal SRREQ to the power management unit 200 to start the operation of the scan mode.

When the operation of the scan mode is terminated, the trigger part 110 may output a reset request to reset the system (step S50). For example, the trigger part 110 may output the reset request to the power management unit 200. The system excluding the memory MEM may be reset to prevent the deletion of the scan data stored in the memory MEM.

When the scan mode has the disabled status, the trigger part 110 output the reset request without the scan operation (step S50). When the scan mode has the disabled status, the trigger part 110 may output the reset request to the power management unit 200. In this case, the all of the elements in the system may be reset.

Figure 7:
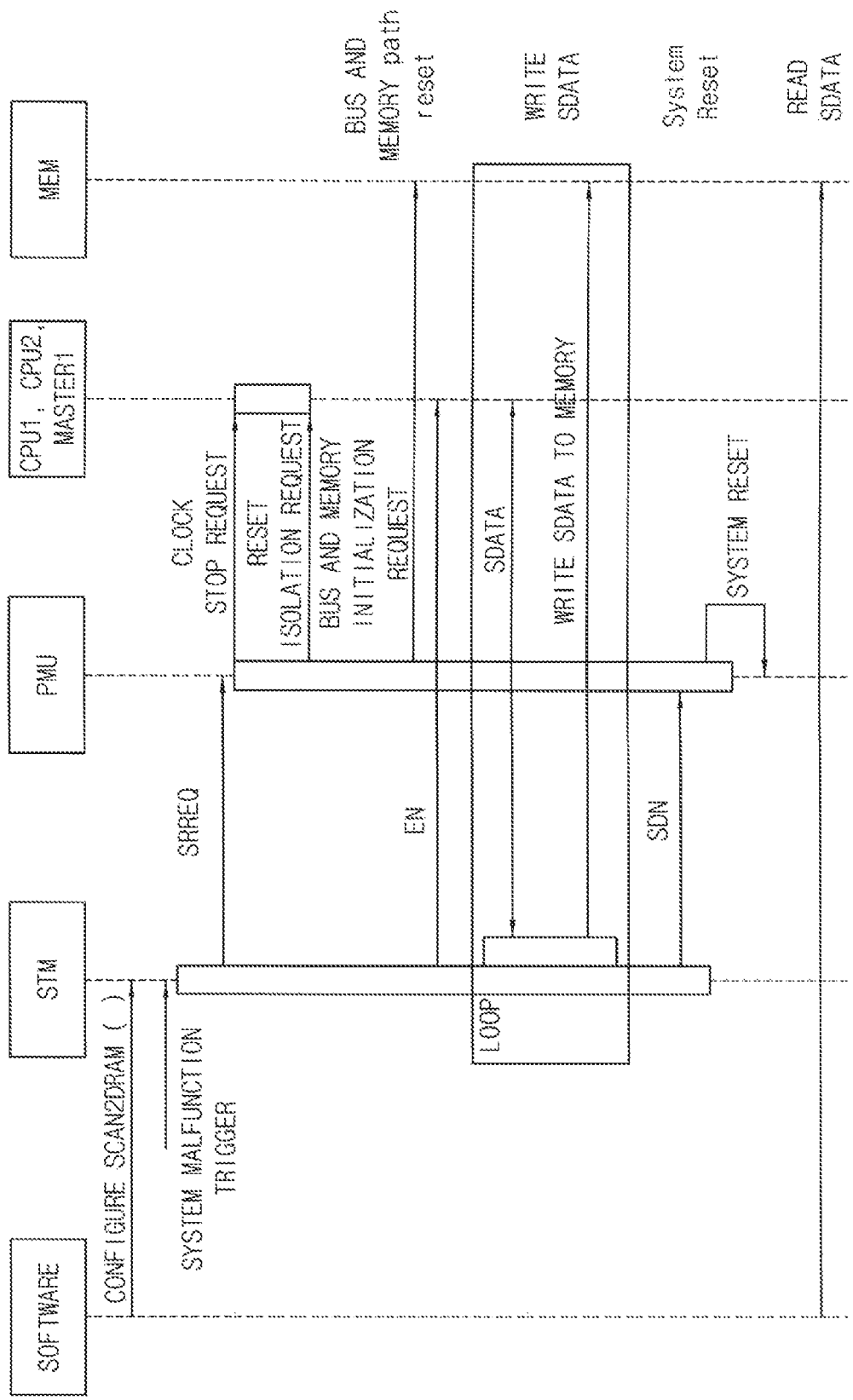
FIG. 7 is a flowchart illustrating an operation of the SOC and the memory in a scan mode.

FIG. 7 is a flowchart illustrating the operation of the SOC and the memory in a scan mode.

Referring to FIGS. 1 to 3 and 7, the SOC may include software, the scan data control apparatus 100, the power management unit 200, the CPU and the master. The SOC may be connected to the memory MEM.

The software may call a function, CONFIGURE SCAN2DRAM( ) to store a configuration value for the operation of the scan mode to the special function register 120 of the scan data control apparatus 100. For example, the software may preset the scan mode enable signal MEN and the masking signal MSK in the special function register 120.

When the trigger signal TRG due to the malfunction of the system is inputted to the scan data control apparatus 100 and the scan mode has the enabled status, the scan data control apparatus 100 outputs the scan mode start signal SRREQ to the power management unit 200.

The power management unit 200 receives the scan mode start signal SRREQ and outputs a clock stop request signal to the CPU and the master to stop a clock signal of the CPU and the master. When the clock stop request signal is received by the CPU and the master, the clock signal applied to the CPU and the master stops for the operation of the scan mode.

The power management unit 200 may output a reset isolation request signal to the CPU and the master to selectively reset the CPU and the master. Some of the CPUs and the masters should be turned on or be reset for the operation of the scan mode according to the statuses of the CPU and the master. Thus, the CPU and the master may be selectively reset in response to the reset isolation request signal.

The clock stop request signal and the reset isolation request signal may be initialization signals for the operation of the scan mode of the CPU and the master.

The power management unit 200 may output a bus and memory initialization request signal to the bus and the memory MEM to initialize the bus and the memory MEM. The bus and the memory MEM may be initialized in response to the bus and memory initialization request signal. When the malfunction of the system has occurred, the bus or the memory MEM may not operate normally. Thus, the initialization of the bus and the memory MEM may be needed to transmit the scan data of the CPU and the master to the memory well.

When the bus and the memory MEM are initialized, the CPU and the master should not be reset so that the bus and memory initialization request signal may be independent from the reset signal of the CPU and the master.

When the bus and the memory MEM operate normally, the initialization of the bus and the memory MEM may be omitted.

When the initialization for the operation of the scan mode is terminated by the power management unit 200, the scan data control apparatus 100 transmits the scan enable signal EN to the CPU and the master. The scan data SDATA of the CPU and the master are written to the memory MEM.

The scan data SDATA of the CPU and the master are received by the shift register 140 of the scan data control apparatus. For example, the scan data SDATA of the CPU and the master may be received by the shift register 140 using the scan clock signal SCK.

The scan data SDATA of the CPU and the master received by the shift register 140 is stored in the memory MEM through the transmitter 150 of the scan data control apparatus 100.

The operation of storing the scan data SDATA of the CPU and the master to the memory MEM through the shift register 140 and the transmitter 150 may be continued until all of the desired scan data SDATA of the CPU and the master are stored in the memory MEM.

When the operation of storing the scan data SDATA is terminated, the trigger part 110 of the scan data control apparatus 100 may output the scan mode end signal SDN to the power management unit 200.

When the operation of storing the scan data SDATA is terminated, the power management unit 200 may reset the system. The memory MEM may be a volatile memory. Thus, the power management unit 200 may reset the system excluding the memory MEM to prevent the deletion of the scan data SDATA stored in the memory MEM.

After the system is reset, the software may read the scan data SDATA from the memory MEM. The software may determine the hardware logic of the CPU and the master at the moment of the system malfunction using the scan data SDATA.

According to the present exemplary embodiment, when the malfunction of the system has occurred, the scan data control apparatus 100 controls the CPU and the master in the scan mode to store the scan data SDATA to the memory MEM in the electronic system. Thus, the reason for the malfunction of the system may be determined using the scan data SDATA of the hardware stored in the memory MEM without an additional debugging apparatus. Therefore, the debugging of the electronic system may be efficiently implemented.

Figure 8:
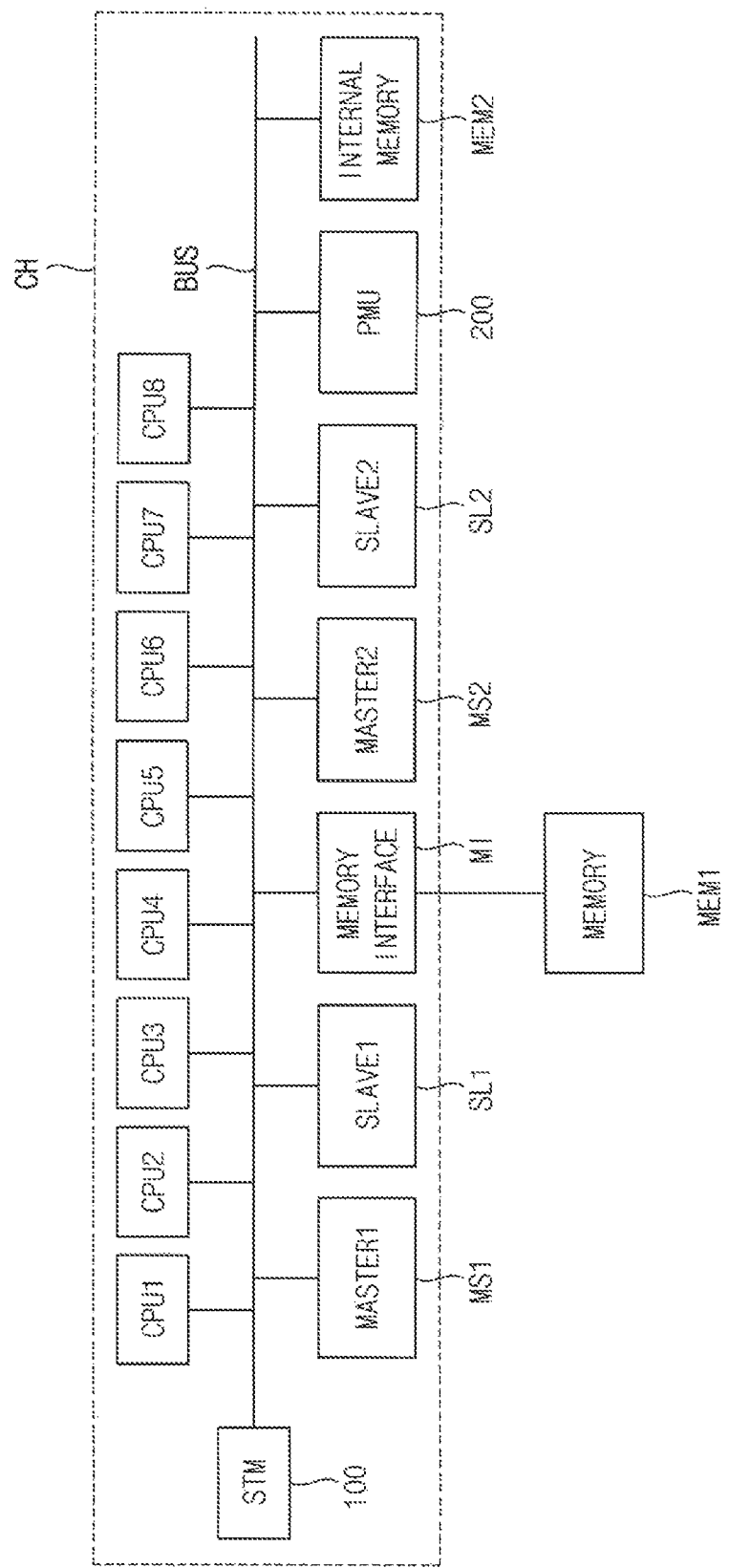
FIG. 8 is a block diagram illustrating an SOC and a memory according to exemplary embodiments.

FIG. 8 is a block diagram illustrating an SOC and a memory according to exemplary embodiments.

The SOC according to the present exemplary embodiment is substantially the same as the SOC of the previous exemplary embodiment explained referring to FIGS. 1 to 7 except that the SOC further includes an internal memory. Thus, the same reference numerals will be used to refer to the same or like parts as those described in the previous exemplary embodiment of FIGS. 1 to 7 and any repetitive explanation concerning the above elements will be omitted.

Referring to FIG. 8, the SOC CH includes a bus transmitting data, a CPU connected to the bus and controlling an operation of a system, a master connected to the bus and generating control, and a slave connected to the bus and receiving or outputting data according to the control of the master.

For example, SOC CH may include a plurality of the CPUs CPU1 to CPU8, a plurality of the masters MS1 and MS2 and a plurality of slaves SL1 and SL2.

The SOC CH may further include a power management unit (PMU) 200. The PMU 200 is connected to the bus and may provide power to the CPU, the masters MS1 and MS2 and the slave SL1 and SL2. The PMU 200 may provide a clock signal to the CPU, the master MS1 and MS2 and the slaves SL1 and SL2.

The SOC CH may further include a memory interface MI connected to the bus and a memory MEM1 and controlling the operation of the memory MEM1.

For example, the memory MEM1 may be a volatile memory device. For example, the memory MEM1 may be one of a dynamic random access memory (DRAM) device, a static random access memory (SRAM) device and a mobile DRAM device.

In the present exemplary embodiment, the memory MEM1 may be formed independently from the SOC CH and externally to the SOC CH.

The SOC may further include an internal memory MEM2 directly connected to the bus and disposed in the SOC CH.

For example, the internal memory MEM2 may be a volatile memory device. For example, the internal memory MEM2 may be one of a dynamic random access memory (DRAM) device, a static random access memory (SRAM) device and a mobile DRAM device.

The SOC CH may further include a scan data control apparatus (STM) 100. The scan data control apparatus 100 may detect a malfunction of the system. The scan data control apparatus 100 may store the scan data of the CPU and the master MS1 and MS2 to the memory MEM1 or the internal memory MEM2. The scan data control apparatus 100 may further store the scan data of the slave SL1 and SL2 to the memory MEM1 or the internal memory MEM2.

The special function register 120 of the scan data control apparatus 100 may output an address ADDR to store the scan data SDATA of the CPU and the master to the transmitter 150. The transmitter 150 may store the scan data SDATA to the address ADDR received from the special function register 120.

In the present exemplary embodiment, the address ADDR may point to one of the memory MEM1 and the internal memory MEM2.

According to the present exemplary embodiment, when the malfunction of the system has occurred, the scan data control apparatus 100 controls the CPU and the master in the scan mode to store the scan data SDATA to the memory MEM1 in the electronic system or the internal memory MEM2 in the SOC. Thus, the reason for the malfunction of the system may be determined using the scan data SDATA of the hardware stored in the memory MEM1 or the internal memory MEM2 in the SOC without an additional debugging apparatus. Therefore, the debugging of the electronic system may be efficiently implemented.

Figure 9:
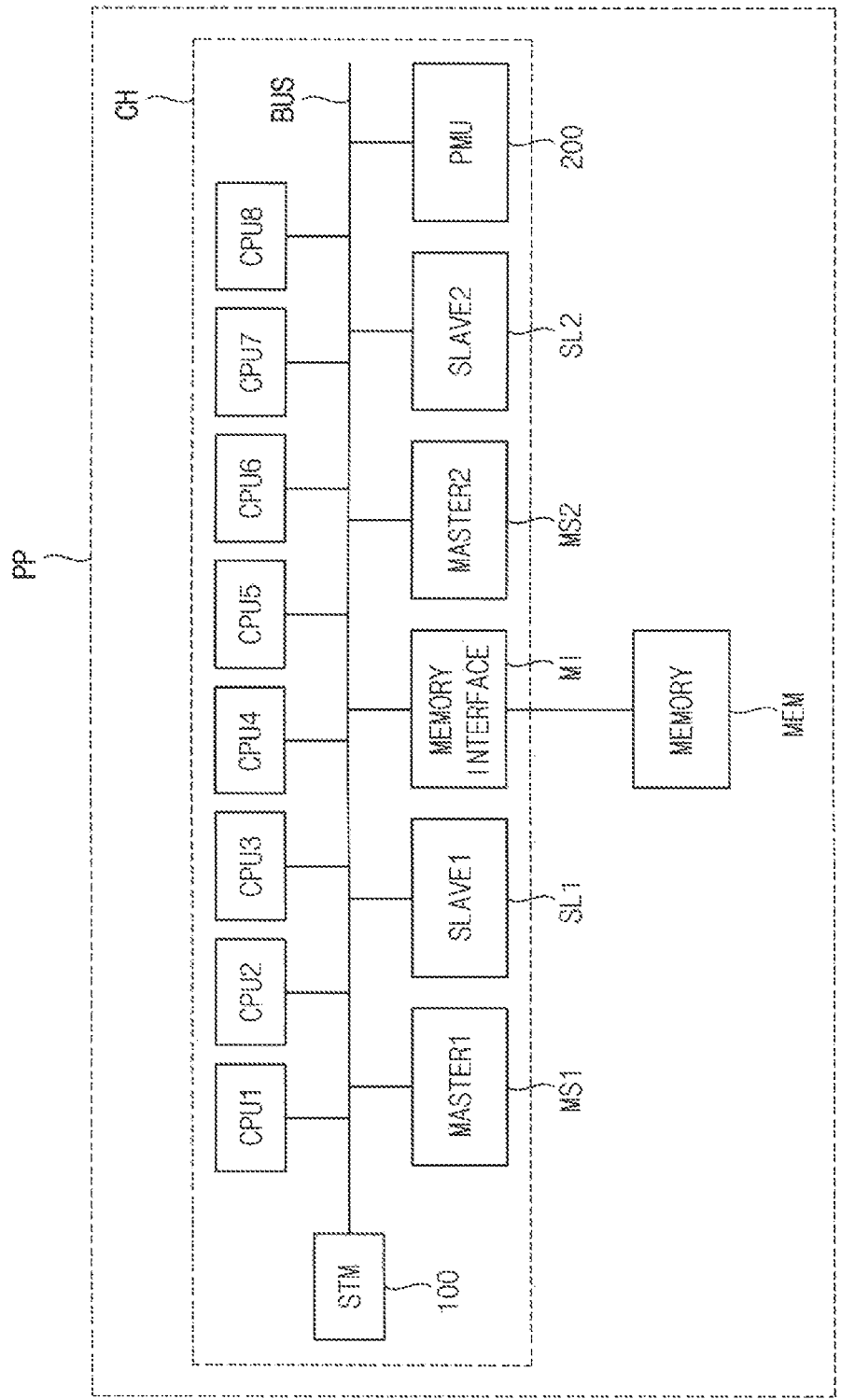
FIG. 9 is a block diagram illustrating an SOC and a memory according to exemplary embodiments.

FIG. 9 is a block diagram illustrating an SOC and a memory according to exemplary embodiments.

The SOC according to the present exemplary embodiment is substantially the same as the SOC of the previous exemplary embodiment explained referring to FIGS. 1 to 7 except that the SOC and the memory form a single package. Thus, the same reference numerals will be used to refer to the same or like parts as those described in the previous exemplary embodiment of FIGS. 1 to 7 and any repetitive explanation concerning the above elements will be omitted.

Referring to FIG. 9, the SOC CH includes a bus transmitting data, a CPU connected to the bus and controlling an operation of a system, a master connected to the bus and generating control, and a slave connected to the bus and receiving or outputting data according to the control of the master.

For example, SOC CH may include a plurality of the CPUs CPU1 to CPU8, a plurality of the masters MS1 and MS2 and a plurality of slaves SL1 and SL2.

The SOC CH may further include a power management unit (PMU) 200. The PMU 200 is connected to the bus and may provide power to the CPU, the masters MS1 and MS2 and the slaves SL1 and SL2. The PMU 200 may provide a clock signal to the CPU, the masters MS1 and MS2 and the slaves SL1 and SL2.

The SOC CH may further include a memory interface MI connected to the bus and a memory MEM and controlling the operation of the memory MEM.

The SOC CH may further include a scan data control apparatus (STM) 100. The scan data control apparatus 100 may detect a malfunction of the system.

In the present exemplary embodiment, the memory MEM and the SOC CH form a single package PP. For example, the memory MEM and the SOC CH may form a package in package.

According to the present exemplary embodiment, when a malfunction of the system has occurred, the scan data control apparatus 100 controls the CPU and the master in the scan mode to store the scan data SDATA to the memory MEM in the electronic system. Thus, the reason for the malfunction of the system may be determined using the scan data SDATA of the hardware stored in the memory MEM without an additional debugging apparatus. Therefore, the debugging of the electronic system may be efficiently implemented.

Figure 10:
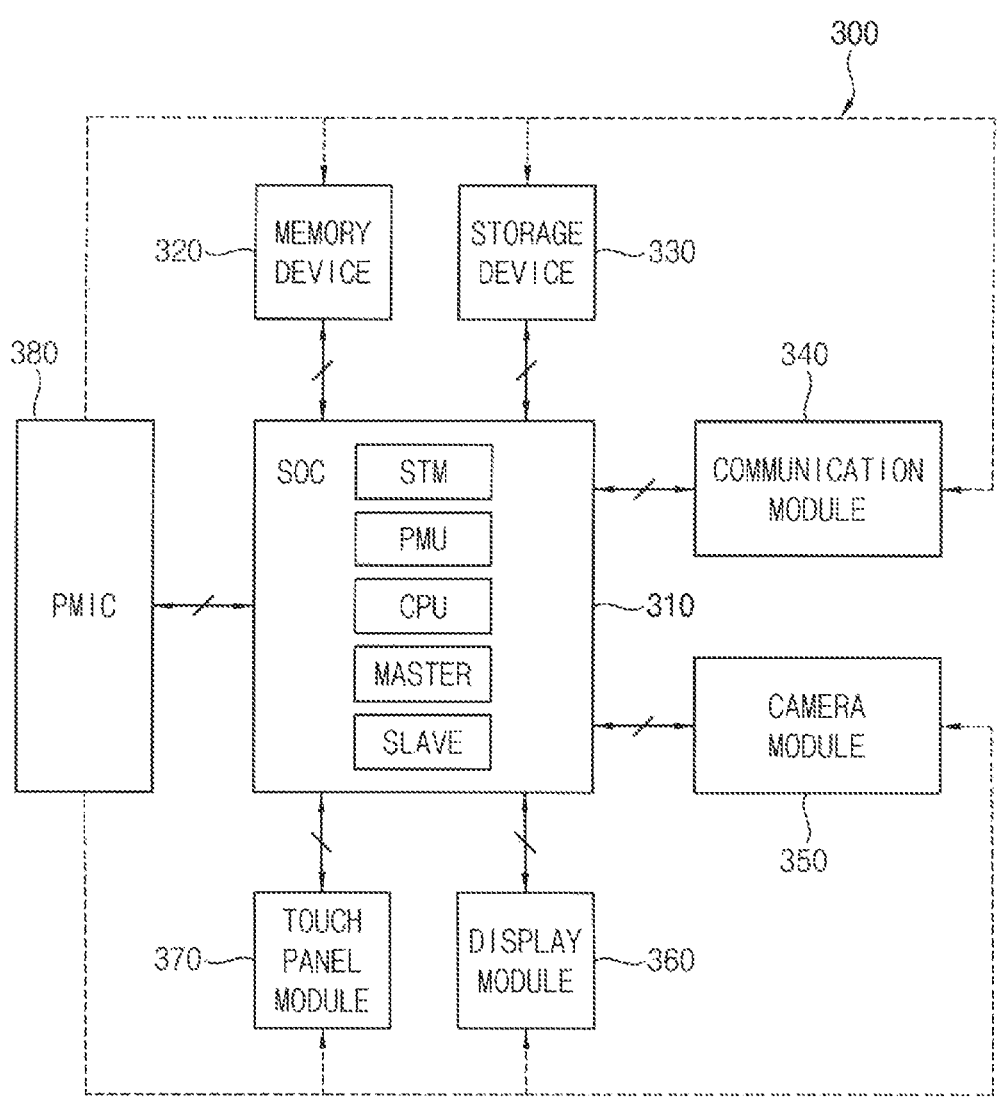
FIG. 10 is a block diagram illustrating an electronic system according to exemplary embodiments.

FIG. 10 is a block diagram illustrating an electronic system according to exemplary embodiments.

Referring to FIG. 10, the electronic system 300 includes a system on chip (SOC) 310, a plurality of functional modules 340, 350, 360 and 370. The electronic system 300 may further include a memory device 320, a storage device 330 and a power management device 380.

The SOC 310 controls overall operations of the electronic system 300. For example, the SOC 310 controls the memory device 320, the storage device 330 and the plurality of functional modules 340, 350, 360 and 370. The SOC 310 may be the SOC CH in FIG. 1. The SOC 310 may include the scan data control apparatus STM, the power management unit PMU, the CPU, the master and the slave.

The memory device 320 and the storage device 330 may store data for the operations of the electronic system 300. The memory device 320 may include a volatile memory device. The storage device 330 may include a nonvolatile memory device. The memory device 320 may be the memory MEM in FIG. 1.

The electronic system 300 may include a communication module 340 operating a communication function, a camera module 350 operating a camera function, a display module 360 operating a displaying function, and a touch panel module 370 operating a touch input function.

The power management device 380 may provide an operating voltage to the SOC 310, the memory device 320, the storage device 330 and the functional modules 340, 350, 360 and 370.

The present disclosure may be used in various kinds of SOCs or a system including the SOCs, such as a mobile phone, a smart phone, a PDA, a PMP, a digital camera, a digital television, a set-top box, a music player, a portable game console, a navigation device, a PC, a server computer, a workstation, a tablet computer, a laptop computer, a smart card, a printer, etc.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A scan data control apparatus comprising:
a trigger circuit configured to receive a trigger signal, detect a malfunction of a system in response to the trigger signal;
a scan sequencer circuit configured to output, in response to the trigger circuit detecting the malfunction, scan enable signals corresponding to a central processing unit (CPU) and a master device to the CPU and the master device, respectively;
a shift register configured to receive, in response to a scan clock signal received from the scan sequencer circuit, scan data of the CPU and the master device from the CPU and the master device, respectively; and
a transmitter circuit configured to receive, from the shift register, the scan data of the CPU and the master device and output the scan data for storage within a memory, wherein
the trigger circuit outputs a scan mode end signal in response to the storage of the scan data within the memory being completed.

2. The scan data control apparatus of claim 1, further comprising a special function register configured to output, to the transmitter circuit, an address within the memory for storing the scan data of the CPU and the master device.

3. The scan data control apparatus of claim 2, wherein the special function register is configured to output a scan mode enable signal, to the trigger circuit, that indicates whether a scan mode exists or not.

4. The scan data control apparatus of claim 2, wherein:
the special function register is configured to output a masking signal to the scan sequencer circuit, and
the masking signal indicates whether each of the CPU and the master device will output the scan data.

5. The scan data control apparatus of claim 1, wherein:
when the trigger signal is inputted to the trigger circuit, the trigger circuit determines that a scan mode has an enabled status,
when the scan mode has the enabled status, the trigger circuit outputs a scan mode start signal, and
when the scan mode has a disabled status, the trigger circuit outputs a system reset signal.

6. The scan data control apparatus of claim 1, wherein the scan sequencer circuit is configured to output a scan clock signal to the CPU, the master device, and the shift register.

7. An electronic system comprising:
a bus configured to transmit data;
a memory configured to store the data;
a central processing unit (CPU) and a master device which are connected to the bus;
a power management circuit connected to the bus and configured to provide power to the CPU and the master device;

a memory interface connected to the bus and configured to control an operation of the memory; and a scan data control circuit configured to detect a malfunction of a system and store scan data of the CPU and the master device within the memory, wherein the scan data control circuit comprises:
- a trigger circuit configured to detect the malfunction of the system;
- a scan sequencer circuit configured to output, in response to the trigger circuit detecting the malfunction, scan enable signals corresponding to the CPU and the master device to the CPU and the master device, respectively;
- a shift register configured to receive the scan data of the CPU and the master device from the CPU and the master device, respectively; and
- a transmitter circuit configured to receive the scan data of the CPU and the master device from the shift register and output the scan data to the memory, wherein the trigger circuit outputs a scan mode end signal in response to storage of the scan data within the memory being completed.

8. The electronic system of claim 7, wherein:

the scan data control circuit further comprises a special function register configured to: (1) output, to the transmitter circuit, an address within the memory for storing the scan data of the CPU and the master device, (2) output, to the trigger circuit, a scan mode enable signal indicating whether a scan mode exists or not, and (3) output a masking signal to the scan sequencer circuit, and the masking signal indicates whether each of the CPU and the master device will output the scan data.

9. The electronic system of claim 8, further comprising software configured to preset the scan mode enable signal and the masking signal within the special function register and read the scan data from the memory.

10. The electronic system of claim 7, wherein the power management circuit is configured to output a clock stop request signal to the CPU and the master device to stop a clock signal of the CPU and the master device.

11. The electronic system of claim 7, wherein the power management circuit is configured to output a reset isolation request signal to the CPU and the master device to selectively reset the CPU and the master device.

12. The electronic system of claim 7, wherein the power management circuit is configured to output a bus and memory initialization request signal to the bus and the memory to initialize the bus and the memory.

13. The electronic system of claim 7, wherein:

the power management circuit is configured to receive a scan mode end signal and reset the electronic system, excluding the memory, and the memory is excluded from being reset to prevent deletion of the scan data stored in the memory.

14. The electronic system of claim 7, further comprising an internal memory directly connected to the bus and disposed in a system-on-chip.

15. A system on chip comprising:
- a scan control circuit that detects a system malfunction and communicates a scan mode start signal in response to detecting the system malfunction;
- a power management circuit that communicates a scan request signal to a processor in response to receiving the scan mode start signal from the scan control circuit; and
- the processor that communicates, in response to a scan enable signal received from the scan control circuit, scan data to the scan control circuit for storage in a memory device.

16. The system on chip of claim 15, wherein the processor communicates the scan data to the scan control circuit in synchronization with a clock signal generated by the scan control circuit.

17. The system on chip of claim 15, wherein the scan control circuit stores the scan data received from the processor in a predetermined address of the memory device, which predetermined address is stored within a register of the scan control circuit.

18. The system on chip of claim 15, wherein the power management circuit communicates, in response to receiving the scan mode start signal from the scan control circuit, a request for the processor to discontinue a clock signal generated by the processor.

19. The system on chip of claim 15, wherein the power management circuit communicates, in response to receiving the scan mode start signal from the scan control circuit, a request for the processor to reset its operation and a request for the memory device to initialize its operation.

* * * * *